United States Patent
Yang

(10) Patent No.: US 10,209,812 B2
(45) Date of Patent: Feb. 19, 2019

(54) TOUCH SUBSTRATE AND TOUCH DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 130 days.

(21) Appl. No.: 14/893,300

(22) PCT Filed: Jun. 18, 2015

(86) PCT No.: PCT/CN2015/081736
§ 371 (c)(1),
(2) Date: Nov. 23, 2015

(87) PCT Pub. No.: WO2016/107098
PCT Pub. Date: Jul. 7, 2016

(65) Prior Publication Data
US 2016/0357313 A1   Dec. 8, 2016

(30) Foreign Application Priority Data
Dec. 29, 2014   (CN) .......................... 2014 1 0848506

(51) Int. Cl.
*G06F 3/044* (2006.01)
*G06F 3/041* (2006.01)
(Continued)

(52) U.S. Cl.
CPC ........ *G06F 3/0416* (2013.01); *G02F 1/13338* (2013.01); *G02F 1/134363* (2013.01);
(Continued)

(58) Field of Classification Search
None
See application file for complete search history.

(56) References Cited

U.S. PATENT DOCUMENTS

2012/0056841 A1   3/2012  Krenik et al.
2013/0257774 A1*  10/2013 Kim .................... H01L 27/1259
                                                      345/173
(Continued)

FOREIGN PATENT DOCUMENTS

CN       102914920 A       2/2013
CN       103049155 A       4/2013
(Continued)

OTHER PUBLICATIONS

International Search Report and Written Opinion both dated Sep. 15, 2015; PCT/CN2015/081736.
(Continued)

*Primary Examiner* — Ifedayo B Iluyomade
(74) *Attorney, Agent, or Firm* — Ladas & Parry LLP

(57) ABSTRACT

A touch substrate and a touch device are provided. The touch substrate includes a thin film transistor, and a common electrode layer and a pixel electrode layer that are transparent. The common electrode layer includes a common electrode and a touch driving electrode that extend along a first direction, and an insulating medium is provided between the common electrode and the touch driving electrode. On the touch substrate, there is further provided a touch sensing electrode that is disposed in a layer different from the touch driving electrode and extends along a second direction, and the touch sensing electrode covers a gap region between the
(Continued)

common electrode and the touch driving electrode. Within a period of displaying a frame of image, the touch driving electrode transmits a common electrode signal and a touch scanning signal in a time-division mode.

19 Claims, 4 Drawing Sheets

(51) Int. Cl.
    *G06F 3/045* (2006.01)
    *H01L 27/32* (2006.01)
    *G02F 1/1333* (2006.01)
    *G02F 1/1343* (2006.01)
    *G02F 1/1341* (2006.01)
    *G02F 1/1335* (2006.01)
    *G02F 1/1362* (2006.01)
    *G02F 1/1368* (2006.01)

(52) U.S. Cl.
    CPC .............. *G06F 3/044* (2013.01); *G06F 3/045* (2013.01); *G06F 3/0412* (2013.01); *H01L 27/323* (2013.01); *G02F 1/1341* (2013.01); *G02F 1/1368* (2013.01); *G02F 1/13439* (2013.01); *G02F 1/133512* (2013.01); *G02F 1/133514* (2013.01); *G02F 1/134309* (2013.01); *G02F 1/136286* (2013.01); *G02F 2001/134372* (2013.01); *G02F 2201/121* (2013.01); *G02F 2201/123* (2013.01); *G06F 2203/04111* (2013.01)

(56) References Cited

U.S. PATENT DOCUMENTS

| | | | |
|---|---|---|---|
| 2014/0111710 A1* | 4/2014 | Yang | ...................... G06F 3/0412 |
| | | | 349/12 |
| 2014/0118299 A1* | 5/2014 | Wang | ..................... G06F 3/0416 |
| | | | 345/174 |
| 2015/0029118 A1 | 1/2015 | Xu et al. | |
| 2015/0309630 A1 | 10/2015 | Yang et al. | |

FOREIGN PATENT DOCUMENTS

| | | |
|---|---|---|
| CN | 103135862 A | 6/2013 |
| CN | 103150070 A | 6/2013 |
| CN | 103760708 A | 4/2014 |
| CN | 103995617 A | 8/2014 |
| CN | 104461161 A | 3/2015 |
| CN | 2014440346 U | 7/2015 |
| JP | 2008-015587 A | 1/2008 |

OTHER PUBLICATIONS

First Chinese Office Action dated Dec. 14, 2016; Appln. No. 201410848506.8.

First Chinese Office Action dated Mar. 31, 2017; Appln. No. 201410848506.8.

\* cited by examiner

TOUCH SUBSTRATE AND TOUCH DEVICE

TECHNICAL FIELD

Embodiments of the present disclosure relate to a touch substrate and a touch device.

BACKGROUND

Regarding display technologies adaptable for attaining wide viewing angle at present, an IPS (In-Plane Switch) technology and an ADSDS (Advanced Super Dimension Switch, briefly called as ADS) technology are widely used. In the ADS technology, a multi-dimensional electric field is formed with both an electric field generated at edges of slit electrodes in a same plane and an electric field generated between a slit electrode layer and a plate-like electrode layer, so that liquid crystal molecules at all orientations, which are provided directly above the electrodes or between the slit electrodes in a liquid crystal cell, can be rotated, In this way, the work efficiency of liquid crystal can be enhanced and the light transmittance can be increased. The ADS technology can improve the image quality of the thin film transistor liquid crystal display (TFT-LCD) and has advantages of high transmittance, wide viewing angle, high aperture ratio, low chromatic aberration, high response speed, free of push Mura, etc.

SUMMARY

According to the embodiments of the present disclosure, there is provided a touch substrate. The touch substrate comprises: a thin film transistor, and a common electrode layer and a pixel electrode layer that are transparent. The common electrode layer includes a common electrode and a touch driving electrode that extend along a first direction, and an insulating medium is provided between the common electrode and the touch driving electrode. On the touch substrate, there is further provided a touch sensing electrode that is disposed in a layer different from the touch driving electrode and extends along a second direction, and the touch sensing electrode covers a gap region between the common electrode and the touch driving electrode. Within a period of displaying a frame of image, the touch driving electrode transmits a common electrode signal and a touch scanning signal in a time-division mode.

According to the embodiments of the disclosure, there is further provided a touch device. The touch device comprises the aforementioned touch substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
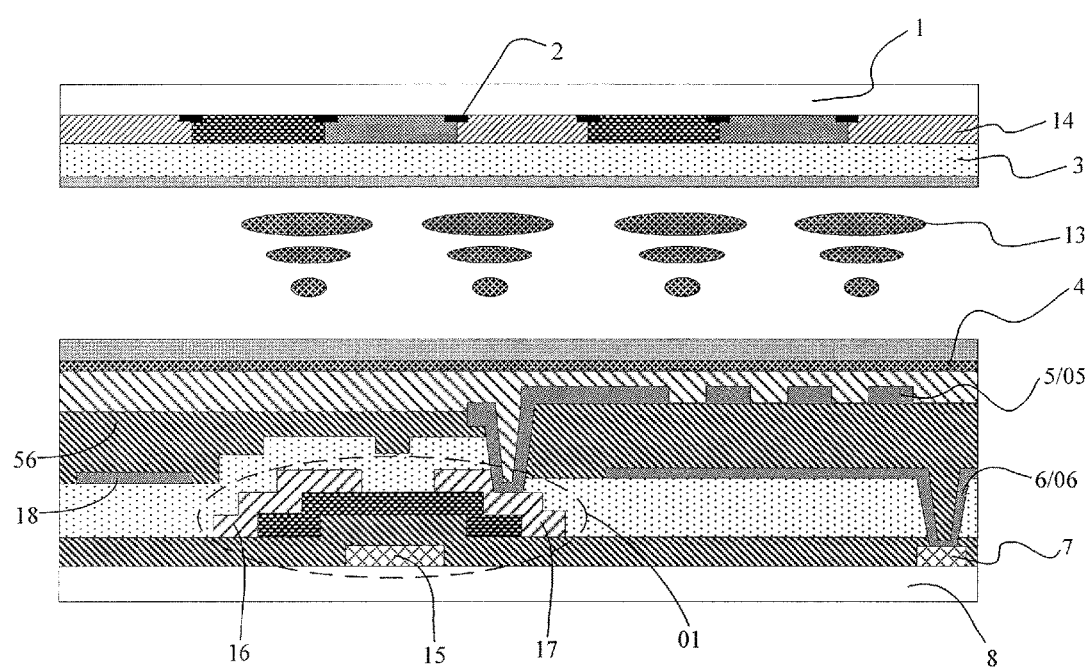
FIG. 1 is a cross-sectional view illustrating a touch device according to embodiments of the disclosure.

In order to make objects, technical details and advantages of the embodiments of the present disclosure apparent, hereinafter, the technical solutions of the embodiments of the present disclosure will be described in a clearly and fully understandable way in connection with the drawings related to the embodiments of the disclosure. It is obvious that the described embodiments are just a part but not all of the embodiments of the disclosure. Based on the described embodiments of the disclosure, those ordinarily skilled in the art can obtain other embodiment(s), without any inventive work, which should be within the scope sought for protection by the disclosure.

It has been noticed by inventor(s) of the present disclosure that, there is a trend to combine the ADS technology and the in-cell touch technology; however, with respect to the issue of how to reduce the node coupling capacitance between touch electrodes, a satisfying technical solution has not been proposed in current in-cell touch panel.

In conjunction with FIG. 1 to FIG. 4, a touch substrate according to at least one embodiment of the disclosure includes a thin film transistor 01, and a common electrode layer 06 and a pixel electrode layer 05 that are transparent; the common electrode layer 06 includes a common electrode 18 and a touch driving electrode 6 that extend along a first direction, an insulating medium 56 is provided between the common electrode 18 and the touch driving electrode 6. On the touch substrate, there is further provided a touch sensing electrode 4 that is disposed in a layer different from the touch driving electrode 6 and extends along a second direction, and the touch sensing electrode 4 covers a gap region 11 between the common electrode 18 and the touch driving electrode 6. Within a period of displaying a frame of image, the touch driving electrode 6 transmits a common electrode signal and a touch scanning signal in a time-division mode.

In practical applications, the arrangement shown in FIG. 1 may be employed to form a liquid crystal display device. For example, in FIG. 1, a color filter layer 14 (e.g. including a red sub-pixel R, a green sub-pixel G and a blue sub-pixel B), a black matrix 2, an overcoating (OC) layer 3 and the like are provided on a base substrate 1, so as to form a color filter substrate; the thin film transistor 01 (e.g. including a gate electrode 15, a source electrode 16 and a drain electrode 17) as well as a gate line (not shown in FIG. 1) connected to the gate electrode 15, a data line (not shown in FIG. 1) connected to the source electrode 16, the touch driving electrode 6, a pixel electrode 5 connected to the drain electrode 17, the touch sensing electrode 4 and the like are provided on a base substrate 8, so as to form an array substrate; and the color filter substrate and the array substrate are bonded with each other to form a liquid crystal cell. In the liquid crystal cell, liquid crystals 13 are filled between the bonded color filter substrate and the array substrate.

For example, the liquid crystal display device shown in FIG. 1 adopts the ADS type array substrate. In FIG. 1, the common electrode layer, the pixel electrode layer and the touch sensing electrode are sequentially disposed on the base substrate 8, and the common electrode layer is closer to the base substrate compared with the pixel electrode layer and the touch sensing electrode. Further, for example, the common electrode layer is a plate-like electrode layer, and the pixel electrode layer is a slit electrode layer.

In the above liquid crystal display device, the array substrate provided with the touch driving electrode 6 and the touch sensing electrode 4 is an example of the touch substrate according to the embodiments of the disclosure.

For example, the gate line 10 and the data line 9 disposed in different layers are formed on the above touch substrate; the touch driving electrode 6 includes a plurality of sub-electrodes 61 (e.g. diamond-shaped sub-electrodes) extending along a direction of the gate line 10 and connected to each other, the common electrode 18 includes a plurality of sub-electrodes 181 (e.g. diamond-shaped sub-electrodes) provided between the sub-electrodes of the touch driving electrode; and the touch sensing electrode 4 includes a plurality of frame-like sub-electrodes 41 (e.g. diamond-shaped frame-like sub-electrodes) extending along a direction of the data line 9 and connected to each other.

Alternatively, for example, the touch driving electrode 6 includes a plurality of sub-electrodes extending along the direction of the data line 9 and connected to each other, the common electrode 18 includes a plurality of sub-electrodes provided between the sub-electrodes of the touch driving electrode 6; and the touch sensing electrode 4 includes a plurality of frame-like sub-electrodes extending along the direction of the gate line 10 and connected to each other.

In the embodiments of the disclosure, the sub-electrodes of the touch driving electrode, the sub-electrodes of the common electrode and the frame-like sub-electrodes of the touch sensing electrode may be in the diamond shape as described above, or may be in other polygonal shape. In the following embodiments and drawings of the disclosure, the diamond shape will be described as an example.

Figure 3:
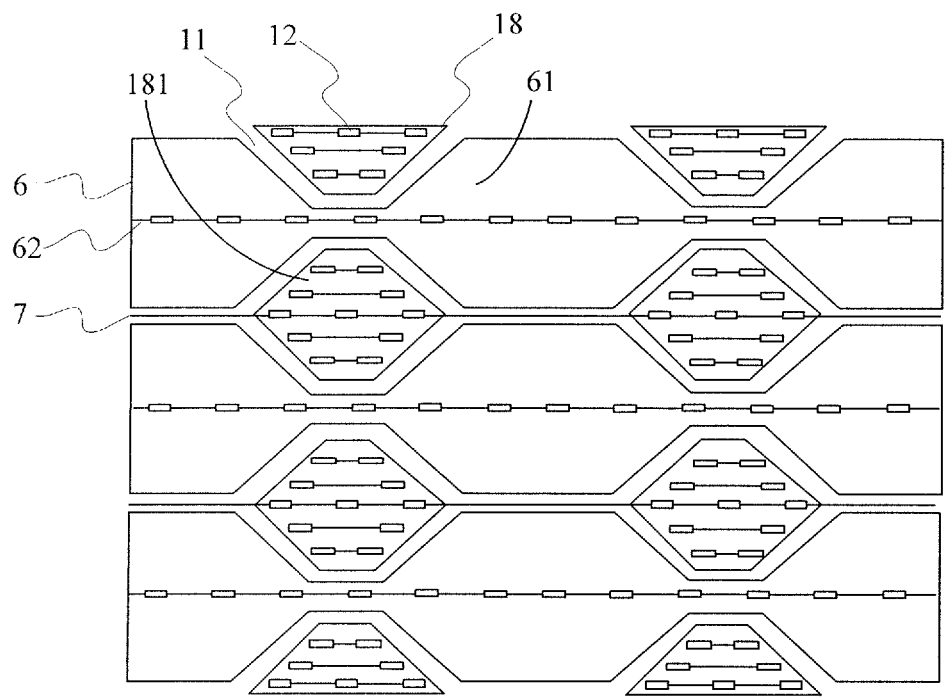
FIG. 3 is a structurally schematic view illustrating a touch driving electrode according to the embodiments of the present disclosure.

In conjunction with FIG. 3, for example, the entirety or a portion of the common electrode layer formed of a transparent metal oxide (e.g. ITO (indium tin oxide)) material is divided into a number of strip electrodes, and the resultant strip electrodes serve as the touch driving electrodes 6. Upon touch control, the touch driving electrodes 6 sever as driving electrodes; upon display, the touch driving electrodes 6 serve as common electrodes.

In the entirety or a portion of the common electrode layer, the gap region 11 for isolating the touch driving electrodes 6 from other portions of the common electrode layer than the touch driving electrodes 6 are provided; and the electrode isolated by the gap region 11 (i.e. electrode surrounded by the gap region 11), as denoted by the common electrode 18 in FIG. 3, is in a floating island shape (e.g., which may have a diamond shape, or other polygonal shape), and is used as a normal common electrode.

The touch driving electrode 6 and the normal common electrode 18 may not have a special positional relationship therebetween; and the touch driving electrode 6 and the normal common electrode 18 may be arbitrarily provided in the entirety or a portion of the common electrode layer. Of course, for the purpose of facilitating the production process, specific design may be applied for the touch driving electrode 6 and the common electrode 18. For example, the driving electrodes 6 and the common electrodes 18 are arranged alternately row by row.

For example, via holes 12 are provided at each of the touch driving electrode 6 and the normal common electrode 18, and the via holes 12 are connected to a connecting line disposed in a same layer as the gate electrode, so as to reduce the resistance.

For example, in at least one embodiment of the disclosure, the plurality of diamond-shaped sub-electrodes of the common electrode 18 are connected with each other by the via holes 12 and a common electrode line 7 disposed in the same layer as the gate line; and/or, the touch driving electrode 6 is connected to a connecting electrode 62 disposed in the same layer as the gate line through the via holes 12.

In the embodiments of the disclosure, for example, the touch sensing electrode 4 covers the gap region 11 between the common electrode and the touch driving electrode.

Figure 4:
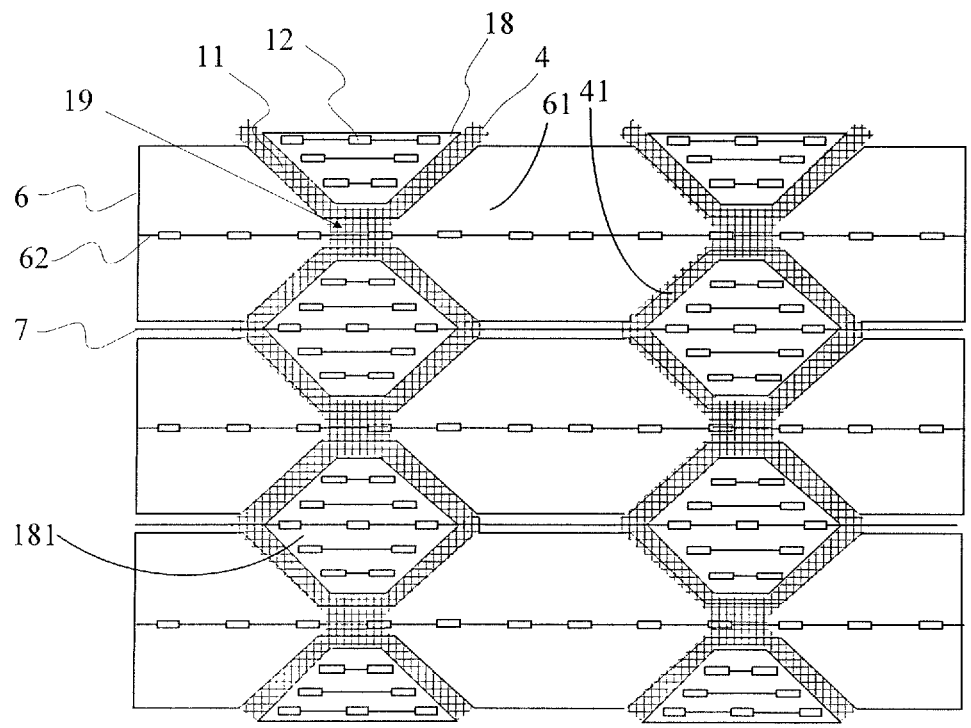
FIG. 4 is a structurally schematic view illustrating a touch sensing electrode according to the embodiments of the disclosure.

For example, as shown in FIG. 4, the touch sensing electrode 4 is provided in the gap region 11, and different touch sensing electrodes 4 are connected with each other by a connecting bridge 19. For example, the touch driving electrodes 6 are arranged in rows, and the touch sensing electrodes 4 are arranged in columns. For example, the gap region 11 is in the shape of the diamond frame or other polygonal frame, and the touch sensing electrode 4 provided in the gap region 11 is also in the shape of the diamond frame or other polygonal frame.

It is to be noted that, for example, the plurality of diamond-shaped frame-like sub-electrodes of the touch sensing electrode 4 are provided not only to cover the gap region between the common electrode and the touch driving electrodes but also to cover a portion of the common electrode. That is, in the premise of ensuring no increase in the overlapping region between the touch sensing electrode 4 and the touch driving electrode 6, the touch sensing electrode 4 may be extended inward, namely, the length that the touch sensing electrode 4 extends inward is increased.

Regarding the material for forming the touch sensing electrodes 4, it needs to be assured that its resistance is as smaller as possible. For example, the material for forming the touch sensing electrodes 4 is a material with a sheet resistance of less than 1, and for example is a metal material.

Figure 2:
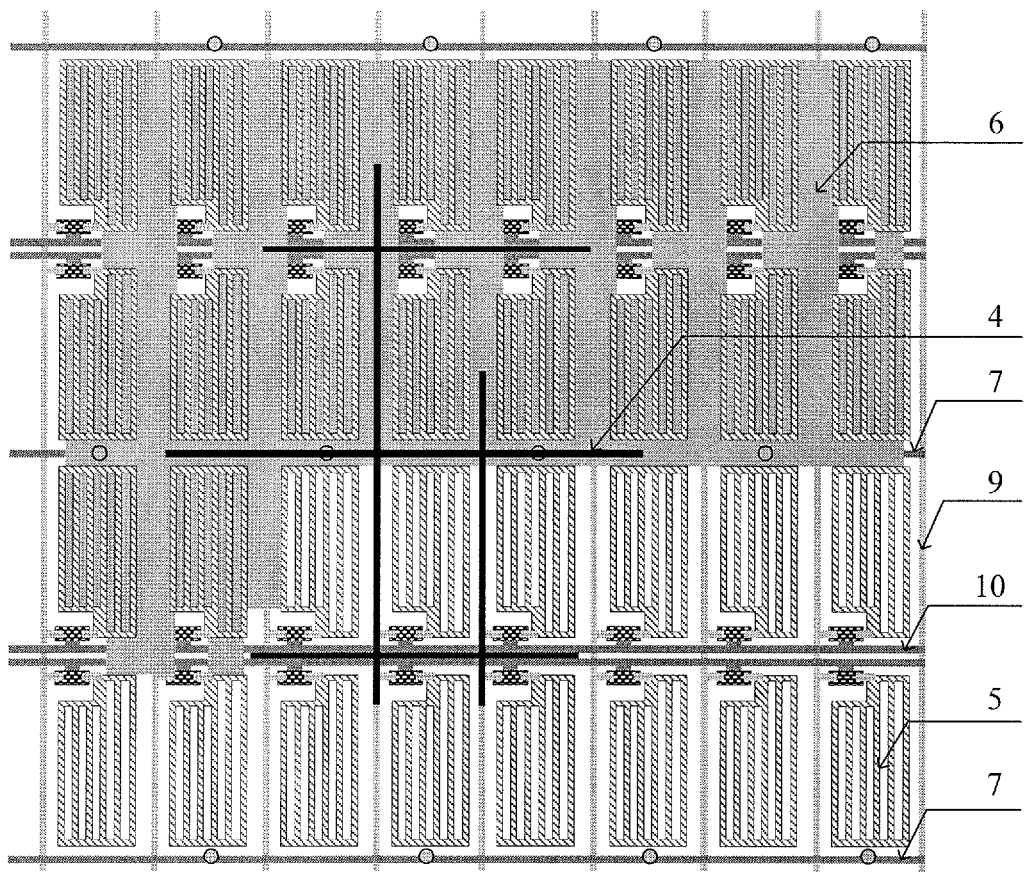
FIG. 2 is a structurally schematic view illustrating an enlarged touch sensing electrode according to the embodiments of the disclosure.

For example, the touch sensing electrode 4 in FIG. 4 is partially enlarged to be shown in FIG. 2. As shown in FIG. 2, the pixel electrode layer includes a plurality of pixel electrodes arranged in a matrix form; the touch sensing electrode 4 includes metallic grid lines that extend transversely or longitudinally and connected with each other, the metallic grid lines extending transversely are provided between adjacent rows of the pixel electrodes, and the metallic grid lines extending longitudinally are provided between adjacent columns of the pixel electrodes. By arranging the touch sensing electrode in this way, not only the touch sensing electrode can be made of the metal material with a lower resistivity, but also the aperture ratio of the touch device will not be reduced.

According to at least one embodiment of the disclosure, there is further provided a touch device, and the touch device includes the touch substrate as described above.

Figure 5:
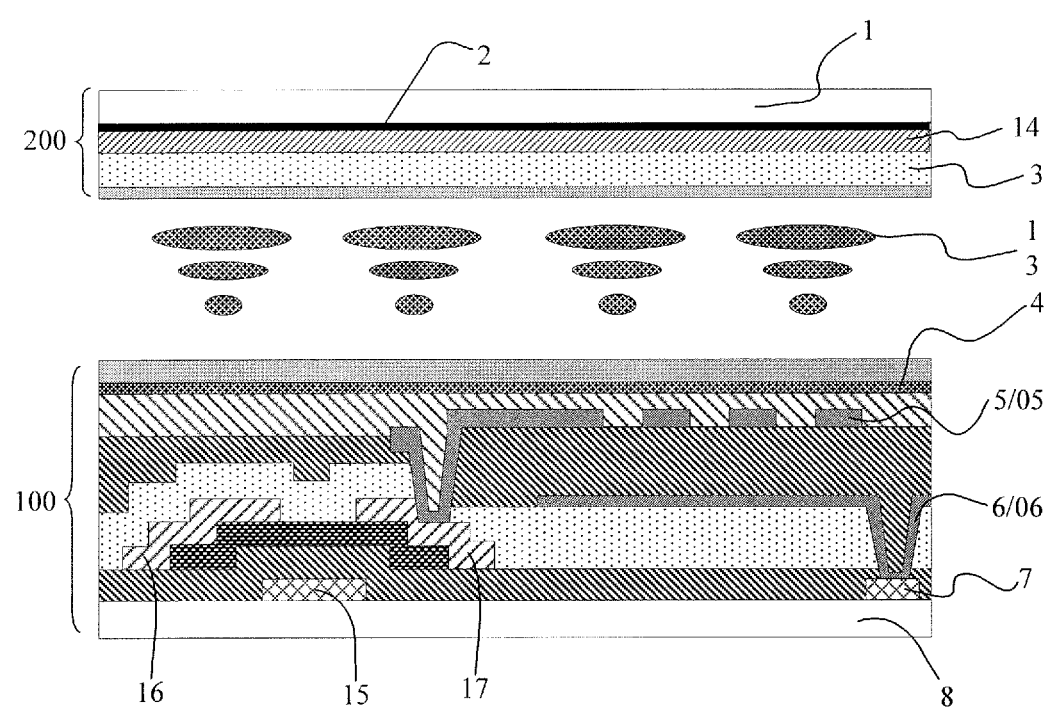
FIG. 5 is a schematically cross-sectional view illustrating a touch device according to the embodiments of the disclosure.

For example, as shown in FIG. 5, the touch device includes the touch substrate 100, and a counter substrate 200 disposed in opposition to the touch substrate 100. A color filter layer 14 and a black matrix 2 are provided on the counter substrate 200; a projection of the touch sensing electrode 4 of the touch substrate 100 on the counter substrate is within a region of the black matrix.

In the embodiments and corresponding drawings of the disclosure, the touch substrate and the touch device are described by taking the liquid crystal display device as an example. However, in addition to being applicable to the liquid crystal display device, the touch substrate according to the embodiments of the disclosure is applicable to an OLED (organic light emitting diode) display to be used as a back panel of the OLED display and obtain the OLED display with a touch function In the touch substrate and the touch device according to the embodiments of the disclosure, the ADS technology and the in-cell touch technology are combined, and the touch driving electrode and the touch sensing electrode are provided in the in-cell touch device with high feasibility. Because there is no overlapped region between the touch driving electrode and the touch sensing electrode, the coupling between the touch driving electrode and the touch sensing electrode is reduced. Thus, according to embodiments of the disclosure, the node capacitance of touch electrodes can be reduced to the maximum extent, and the RC delay is assured of meeting requirements of the IC design. In addition, because both the touch driving electrode and the touch sensing electrode are arranged on the same touch substrate, the difficulty of IC matching is reduced to the maximum extent. In this way, One Chip configuration by integrating driving ICs and touch ICs of the display device is more easily achieved, so as to adapt to the development requirements of the display device in the future and improve the market competitiveness of the products.

The descriptions made above are merely exemplary embodiments of the present disclosure, but are not used to limit the protection scope of the present disclosure. The protection scope of the present disclosure is determined by attached claims.

This application claims the benefit of priority from Chinese patent application No. 201410848506.8, filed on Dec. 29, 2014, the disclosure of which is incorporated herein in its entirety by reference as a part of the present application.

The invention claimed is:

1. A touch substrate, comprising a base substrate, a thin film transistor, and common electrode layer and a pixel electrode layer that are transparent, the thin film transistor, the common electrode layer and the pixel electrode layer being on the base substrate, wherein, the common electrode layer includes a common electrode and a touch driving electrode that extend along a first direction, and an insulating medium is provided between the common electrode and the touch driving electrode; on the base substrate, there is further provided a plurality of touch sensing electrodes that are disposed in a layer different from the touch driving electrode and extend along a second direction, the common electrode does not further serve as the touch driving electrode, and the plurality of touch sensing electrodes covers a gap region between the common electrode and the touch driving electrode; within a period of displaying a frame of image, the touch driving electrode transmits a common electrode signal and a touch scanning signal in a time-division mode; there is no overlapped region between the touch driving electrode and each of the plurality of touch sensing electrodes; and the common electrode layer, the pixel electrode layer and the plurality of touch sensing electrodes are sequentially disposed on the base substrate, and the common electrode layer is closer to the base substrate compared with the pixel electrode layer and the plurality of touch sensing electrodes.

2. The touch substrate according to claim 1, wherein, a gate line and a data line disposed in different layers are formed on the base substrate;
the touch driving electrode includes a plurality of sub-electrodes extending along a direction of the gate line and connected to each other, the common electrode includes a plurality of sub-electrodes provided between the sub-electrodes of the touch driving electrode; and
each of the plurality of touch sensing electrodes includes a plurality of frame-like sub-electrodes extending along a direction of the data line and connected to each other.

3. The touch substrate according to claim 1, wherein, a gate line and a data line disposed in different layers are formed on the base substrate;
the touch driving electrode includes a plurality of sub-electrodes extending along a direction of the data line and connected to each other, the common electrode includes a plurality of sub-electrodes provided between the sub-electrodes of the touch driving electrode; and
each of the plurality of touch sensing electrodes includes a plurality of frame-like sub-electrodes extending along a direction of the gate line and connected to each other.

4. The touch substrate according to claim 2, wherein, the plurality of sub-electrodes of the touch driving electrode are diamond-shaped electrodes,
the plurality of sub-electrodes of the common electrode are diamond-shaped electrodes, and
the plurality of frame-like sub-electrodes of each of the plurality of touch sensing electrodes are diamond-shaped frame-like electrodes.

5. The touch substrate according to claim 2, wherein, the plurality of sub-electrodes of the common electrode are connected with each other by a common electrode line disposed in a same layer as the gate line.

6. The touch substrate according to claim 2, wherein, the touch driving electrode is connected to a connecting electrode through a hole, and the connecting electrode is disposed in a same layer as the gate line.

7. The touch substrate according to claim 2, wherein, the plurality of frame-like sub-electrodes of each of the plurality of touch sensing electrodes are provided not only to cover the gap region between the common electrode and the touch driving electrodes but also to cover a portion of the common electrode.

8. The touch substrate according to claim 1, wherein, the pixel electrode layer includes a plurality of pixel electrodes arranged in a matrix form;
each of the plurality of touch sensing electrodes includes metallic grid lines that extend transversely or longitudinally and connected with each other, the metallic grid lines extending transversely are provided between adjacent rows of the pixel electrodes, and the metallic grid lines extending longitudinally are provided between adjacent columns of the pixel electrodes.

9. The touch substrate according to claim 1, wherein, the common electrode layer is a plate-like electrode layer, and the pixel electrode layer is a slit electrode layer.

10. A touch device, comprising the touch substrate according to claim 1.

11. The touch device according to claim 10, further comprising a counter substrate, wherein,
a color filter layer and a black matrix are provided on the counter substrate; and
a projection of each of the plurality of touch sensing electrodes of the touch substrate on the counter substrate is within a region of the black matrix.

12. The touch substrate according to claim 3, wherein, the plurality of sub-electrodes of the touch driving electrode are diamond-shaped electrodes,
the plurality of sub-electrodes of the common electrode are diamond-shaped electrodes, and
the plurality of frame-like sub-electrodes of each of the plurality of touch sensing electrodes are diamond-shaped frame-like electrodes.

13. The touch substrate according to claim 3, wherein, the plurality of sub-electrodes of the common electrode are connected with each other by a common electrode line disposed in a same layer as the gate line.

14. The touch substrate according to claim 3, wherein, the touch driving electrode is connected to a connecting electrode through a hole, and the connecting electrode is disposed in a same layer as the gate line.

15. The touch substrate according to claim 3, wherein, the plurality of frame-like sub-electrodes of each of the plurality of touch sensing electrodes are provided not only to cover the gap region between the common electrode and the touch driving electrodes but also to cover a portion of the common electrode.

16. The touch substrate according to claim 2, wherein, the pixel electrode layer includes a plurality of pixel electrodes arranged in a matrix form; each of the plurality of touch sensing electrodes includes metallic grid lines that extend transversely or longitudinally and connected with each other, the metallic grid lines extending transversely are provided between adjacent rows of the pixel electrodes, and the metallic grid lines extending longitudinally are provided between adjacent columns of the pixel electrodes.

17. The touch substrate according to claim 2, wherein, the common electrode layer, the pixel electrode layer and the plurality of touch sensing electrodes are sequentially disposed on the base substrate, and the common electrode layer is closer to the base substrate compared with the pixel electrode layer and the plurality of touch sensing electrodes.

18. The touch substrate according to claim 3, wherein, the pixel electrode layer includes a plurality of pixel electrodes arranged in a matrix form; each of the plurality of touch sensing electrodes includes metallic grid lines that extend transversely or longitudinally and connected with each other, the metallic grid lines extending transversely are provided between adjacent rows of the pixel electrodes, and the metallic grid lines extending longitudinally are provided between adjacent columns of the pixel electrodes.

19. The touch substrate according to claim 3, wherein, the common electrode layer, the pixel electrode layer and the plurality of touch sensing electrodes are sequentially disposed on the base substrate, and the common electrode layer is closer to the base substrate compared with the pixel electrode layer and the plurality of touch sensing electrodes.

* * * * *